US011029377B2

(12) United States Patent
Connell et al.

(10) Patent No.: US 11,029,377 B2
(45) Date of Patent: Jun. 8, 2021

(54) METHOD AND SYSTEM FOR REDUCING MAGNETIC FIELD INSTABILITIES IN A MAGNETIC RESONANCE SYSTEM

(71) Applicants: Ian Connell, Toronto (CA); Chad Harris, Toronto (CA); Geron Bindseil, Toronto (CA); Andrew T. Curtis, Toronto (CA)

(72) Inventors: Ian Connell, Toronto (CA); Chad Harris, Toronto (CA); Geron Bindseil, Toronto (CA); Andrew T. Curtis, Toronto (CA)

(73) Assignee: Synaptive Medical Inc., Toronto (CA)

( * ) Notice: Subject to any disclaimer, the term of this patent is extended or adjusted under 35 U.S.C. 154(b) by 0 days.

(21) Appl. No.: 16/558,893

(22) Filed: Sep. 3, 2019

(65) Prior Publication Data

US 2021/0063516 A1 Mar. 4, 2021

(51) Int. Cl.
*G01R 33/3875* (2006.01)
*G01R 33/54* (2006.01)
*G01R 33/381* (2006.01)

(52) U.S. Cl.
CPC ....... *G01R 33/3875* (2013.01); *G01R 33/381* (2013.01); *G01R 33/543* (2013.01)

(58) Field of Classification Search
CPC . G01R 33/3875; G01R 33/381; G01R 33/543
See application file for complete search history.

(56) References Cited

U.S. PATENT DOCUMENTS

2017/0089992 A1\* 3/2017 Sakakibara ............ H01F 6/008
2019/0090777 A1\* 3/2019 Leghissa ............ G01R 33/5611

\* cited by examiner

*Primary Examiner* — G.M. A Hyder
(74) *Attorney, Agent, or Firm* — Ridout & Maybee LLP

(57) ABSTRACT

A method, device, and system for reducing inhomogeneity in an imaging magnetic field during magnetic resonance imaging is described. The method includes generating a corrective magnetic field during imaging, the corrective magnetic field having a first magnetic field component and a second magnetic field component with a phase separation therebetween. The first and second components are generated according to a stability parameter decomposed from a stability field that correct an instability identified within the imaging magnetic field.

15 Claims, 7 Drawing Sheets

METHOD AND SYSTEM FOR REDUCING MAGNETIC FIELD INSTABILITIES IN A MAGNETIC RESONANCE SYSTEM

FIELD

The present disclosure is related to systems and methods for magnetic resonance. More particularly, the disclosure relates to systems and methods for reducing magnetic field instabilities that are constant or sporadic in a magnetic resonance system over time.

BACKGROUND

Magnetic resonance imaging (MRI) is generally performed with very strong static magnetic fields. The static magnetic field, referred to as the "main field" or "BO field", is responsible for polarizing nuclei and is required for imaging during nuclear magnetic resonance.

A spatially homogeneous BO field is desired across the imaging field-of-view (FOV) to ensure equal polarization of the subject and to remove BO-inhomogeneity weighting in the reconstructed images. MRI necessitates the use of multiple acquisitions that perform nuclear excitation and relaxation, as the entire FOV is traversed by imaging gradients. Thus, any variation in the BO-field from acquisition-to-acquisition over time tends to manifest itself as artifacts or ghosts in the reconstructed images. As such, temporal homogeneity of the BO field is important.

Aside from static sources of magnetic field instabilities that do not change over time, such as ferrous material located inside the imaging FOV, and paramagnetic patient implants etc., magnetic field instabilities may arise from sources within, or in the vicinity of, the MRI scanner. Such sources of instability may be cyclical or sporadic. They include movement of a cold head in a superconducting magnet system, mechanical vibrations of the superconducting structure, presence of moving ferromagnetic material outside of the fringe field of the MRI scanner, and eddy current production from moving electrically-conductive material in the presence of a spatially-varying magnetic field.

These field instabilities may have a relative spatial distribution that changes as a function of time. Thus, there remains a need to provide systems and methods for reducing or otherwise eliminating magnetic field instabilities caused by temporal instabilities in magnetic resonance systems.

SUMMARY

In some examples, the present disclosure provides method for reducing inhomogeneity in an imaging magnetic field during magnetic resonance imaging, the method comprising: generating a corrective magnetic field during imaging, the corrective magnetic field having a first magnetic field component and a second magnetic field component with a phase separation therebetween, the first and second components being generated according to a stability parameter decomposed from a stability field that corrects an instability identified within the imaging magnetic field.

In some examples, the present disclosure provides an electromagnet assembly for reducing inhomogeneity in an imaging magnetic field in an imaging bore of a magnetic resonance imaging system during imaging, the electromagnet assembly configured to generate a corrective magnetic field according a stability parameter that corrects an instability identified within the imaging magnetic field, the corrective magnetic field having a first magnetic field component and a second magnetic field component with a phase separation therebetween.

In some examples, the present disclosure provides a system for reducing inhomogeneity in an imaging magnetic field in an imaging bore of a magnetic resonance imaging system during imaging, the system comprising: an electromagnet assembly configured to generate a corrective magnetic field in the imaging bore, the corrective magnetic field being generated according to a stability parameter that corrects an instability identified within the imaging magnetic field, the corrective magnetic field having a first magnetic field component and a second magnetic field component with a phase separation therebetween.

The foregoing and other aspects and advantages of the present disclosure will appear from the following description. In the description, reference is made to the accompanying drawings that form a part hereof, and in which there is shown by way of illustration a preferred embodiment. Such embodiment does not necessarily represent the full scope of the disclosure, however, and reference is made therefore to the claims and herein for interpreting the scope of the disclosure.

BRIEF DESCRIPTION OF THE DRAWINGS

Reference will now be made, by way of example, to the accompanying drawings which show example embodiments of the present application, and in which.

DETAILED DESCRIPTION

Described herein are systems, devices, and methods for mitigating the effects of temporal magnetic field instabilities caused by cyclical or sporadic perturbations over time in the main magnetic field of magnetic resonance systems, such as magnetic resonance imaging ("MRI") systems, nuclear magnetic resonance ("NMR") systems, or the like.

Figure 1:
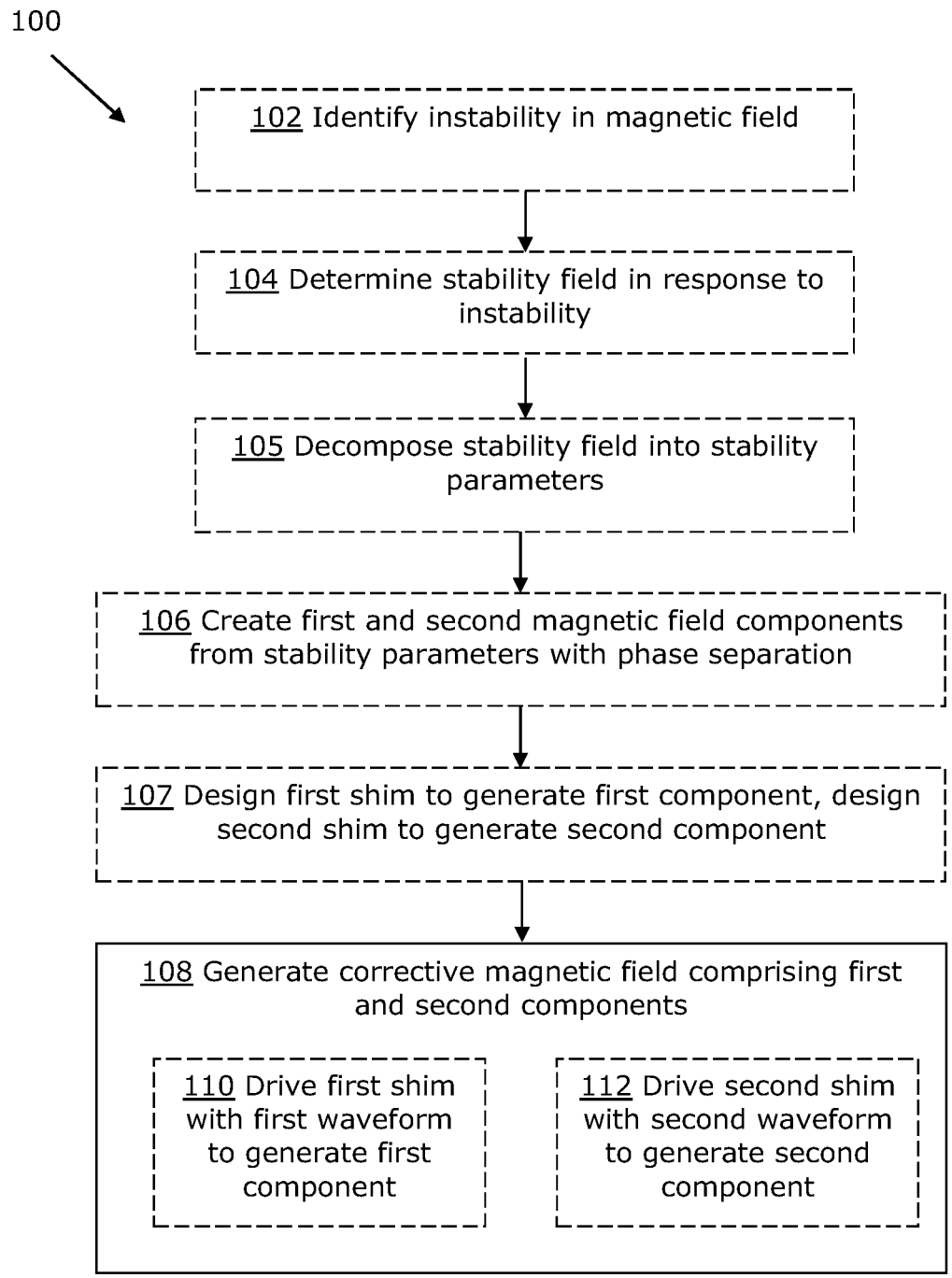
FIG. 1 is a flowchart setting forth the steps of an example method for reducing inhomogeneity in an imaging magnetic field during magnetic resonance imaging.
Figure 2:
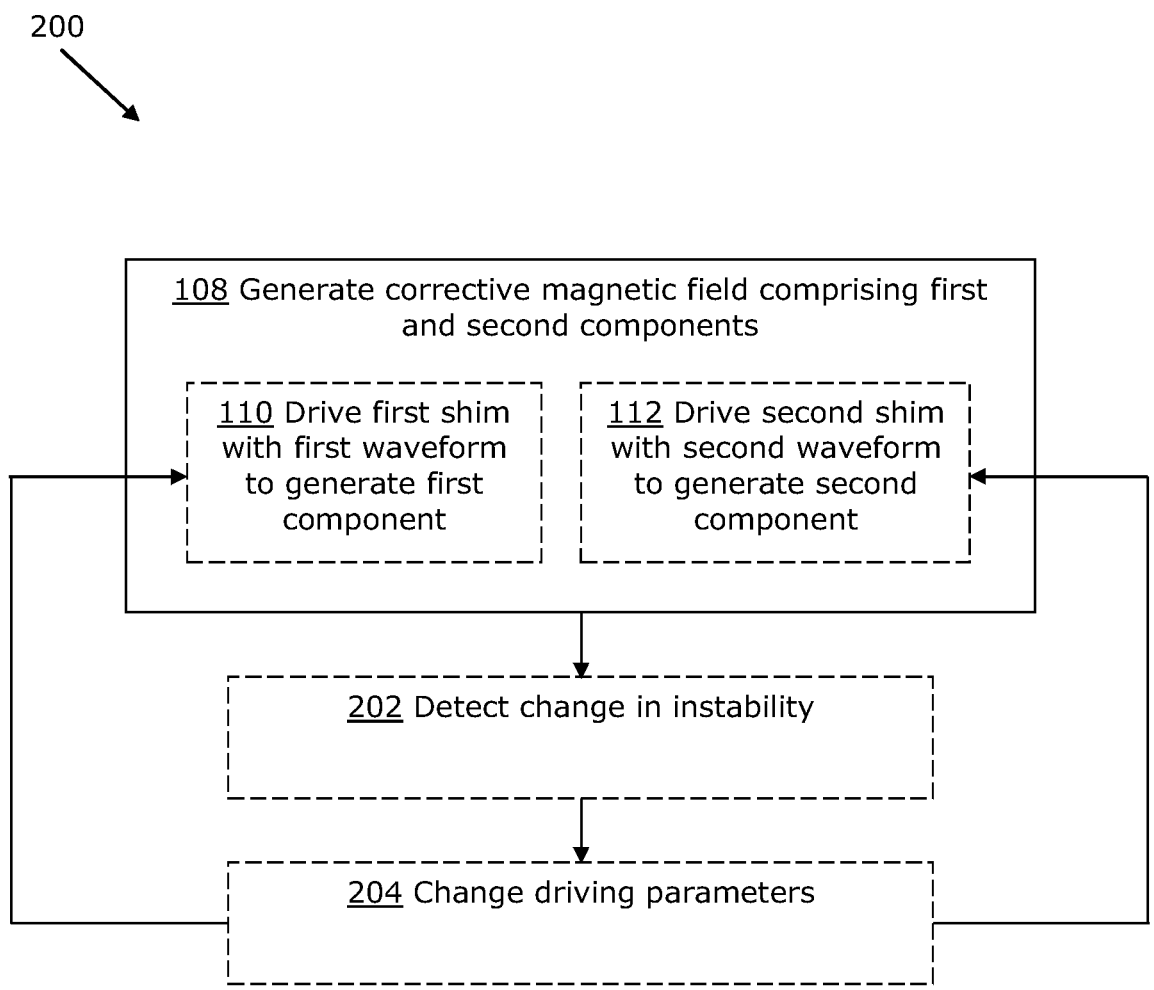
FIG. 2 is a flowchart setting forth the steps of an example method for reducing sporadic inhomogeneity in an imaging magnetic field during magnetic resonance imaging.

Referring to FIGS. 1 and 2, there are illustrated example methods for mitigating temporal magnetic field instability during MRI imaging.

Method 100 shown in FIG. 1 sets forth example steps for reducing inhomogeneity in an imaging magnetic field during magnetic resonance imaging. At 102, an instability in the magnetic field is identified. The instability has a relative spatial distribution that changes over time. In some examples, the instability may have a spatial distribution that changes over time in a cyclical manner. For example, the instability may be due to vibrations caused by operation of a cryocooler, movement of ferrous materials in the fringe field of the MRI and/or the induction of extraneous eddy currents on conducting structures in the MRI. Even harmonic sources of BO instability can produce eddy currents that result in a non-uniform Bz distortion across the field-of-view (FOV) and accrue spatially-variant phase.

In certain applications, after the magnetic field in an imaging region has been mapped at multiple time points (to get a time-space map), the magnetic field in the imaging region is processed. In certain applications, the magnetic field in the imaging region is then decomposed into two or more general components. The instability may be then identified as two or more unwanted general components in the inhomogeneous field.

At 104, a stability field is then determined in response to the instability in the imaging magnetic field. The stability field is a magnetic field that is similar but opposite to that caused by the instability in the imaging magnetic field. In other words, the stability field may be a magnetic field that has similar, or the same, spatial distribution as the unwanted component, but is opposite thereto.

At 105, this stability field may be decomposed into a spatial (e.g. spherical harmonics) and/or a temporal (e.g. Fourier components) basis. In one embodiment, the stability field is first decomposed temporally (into the Fourier or frequency domain). Next, the magnitude/amplitude and phase of a given Fourier component is extracted for each spatial position as stability parameters. For example, the most dominant, common, frequency between all points is extracted from the spectrum.

The amplitude and phase of the selected Fourier component for each spatial position (i.e. the stability parameters) are then used at 106 to create at least two target spatial magnetic field components with a phase separation therebetween, such as a first magnetic field and a second magnetic field. The first magnetic field component may be "in-phase" (e.g., by sampling the magnetic field with the phase at each spatial location to be 0 degrees) and the second magnetic field component may be "out-of-phase" (e.g., by sampling the magnetic field with the phase at each spatial location to be shifted 90 degrees, thus out-of-phase relative to the in-phase component).

At 107, two electromagnets are then designed and created to produce the respective first and second, or in-phase and out-of-phase, target magnetic fields. The in-phase (sometimes denoted "real") and out-of-phase (sometimes denoted "imaginary") electromagnets would then be driven with a first waveform and a second waveform respectively.

A corrective magnetic field, which comprises the in-phase magnetic field component and the out-of-phase magnetic field component (or first and second component), is then generated in the imaging region at 108 to eliminate the Bz-component of the field instability. In other words, the first and second components are being generated according to stability parameters that were decomposed from the stability field which corrects an instability identified within the imaging magnetic field. As understood by the skilled person, the in-phase and out-of-phase magnetic field components generated by the first and second waveforms are generated with different phases, or not in phase with each other.

In certain applications, the phase shift or separation between the first and second waveforms (or between the first and second components) may be fixed, for example, where the fixed phase shift may be 90 degrees. When the stability field is decomposed into its real and imaginary components, the phase shift between the first and second waveforms may be 90 degrees. In other applications, the phase shift between the first and second waveforms may be smaller or larger than 90 degrees.

To generate the corrective magnetic field, a first electromagnet and a separate second electromagnet in the MRI system may be driven at 110 and 112. In particular, as noted above, the first electromagnet would be designed to generate the first magnetic field of the corrective magnetic field according to the first waveform and the second electromagnet would be designed to generate the second magnetic field of the corrective magnetic field according to the second waveform. The first electromagnet may, thus, be a first shim coil and the second electromagnet may be a second shim coil.

In this manner, the temporal BO inhomogeneity is accounted for when the "imaginary" second shim coil is driven out of phase, 90 degrees out of phase for example, with the "real" first shim coil.

Each coil is responsible for removing the respective variation in the magnetic field. When these two coils are driven simultaneously with a fixed phase shift between them, and with the appropriate amount of current (so as to produce an equal but opposite magnetic field to that of the instability), a spatially-varying distribution in response to the BO instability, or the corrective magnetic field, is generated.

By superimposing or merging the corrective magnetic field with the main magnetic field together, the magnetic field instability or inhomogeneity is reduced, neutralized, or cancelled spatially and temporally.

While method 100 has been described as including identifying the instability (102), determining the stability field (104), decomposing the stability field into stability parameters (105), creating the first and second magnetic field components (106), and designing the first and second electromagnets (107), steps 102, 104, 105, 106, and 107 are optional. Only 108, that of generating the corrective magnetic field according to the at least two spatial magnetic field components (such as the first and second magnetic field components) with a phase separation therebetween is required for the instability to be mitigated or corrected. In that manner, steps 102, 104, 105, 106, and 107 may be performed separately from 108, such as during calibration, installation, etc. prior to step 108.

As well, that the corrective magnetic field is generated by driving first and second shims according to the first and second waveforms with different phases, to generate the first and second magnetic field components, 110 and 112, is also optional. The corrective magnetic field may be generated by a different electromagnet system or structure so long as the first and second magnetic field components of the corrective magnetic field with a phase separation therebetween is generated.

While two magnetic field components are discussed above, three or more magnetic field components may be generated with phase separations therebetween (i.e., each component is phase-shifted relative to each other component, such that none of the components are at the same phase). If there are three (or more) magnetic field components, any one of those might be considered the "in-phase" component, while the other two (or more) may be considered the "out-of-phase" components. As well, if three (or more) spatial magnetic field components are generated, three (or more) electromagnets may then be designed and created to produce the respective first, second, and third (or more) target magnetic fields.

If the instability is predictable or cyclical (e.g., arising due to a predictable or cyclical source), method 100 may be performed in a closed loop fashion, where the BO fluctuation may be measured, characterized, and reduced or nulled without feedback in space and time (i.e. magnitude and phase).

If the instability is unpredictable or sporadic, method 200 may be performed in an open loop manner, where the magnetic field instability may be measured, instability feedback acquired, and the corrective magnetic field changed according to the feedback.

Method 200 shown in FIG. 2 sets forth example steps for reducing sporadic inhomogeneity in an imaging magnetic field during magnetic resonance imaging. Method 200 may involve steps 102 to 112 of method 100. In particular, method 200 includes at least generating the corrective magnetic field in the imaging region at 108. The corrective magnetic field, comprising the first and second magnetic field components, is generated according to the first waveform (110) and the second waveform (112). As noted above, the first and second waveforms are generated out of phase with one another.

At 202, a change in the instability in the main imaging magnetic field may be detected. The change may be detected by a system of field detectors built into the MRI system. Examples of such field detectors include field sensors inside the bore of the magnet and/or field sensors outside the bore of the magnet in the MRI room that are monitored continuously. The system may include field measuring devices located within or around the system. For example, the system may also involve a sensor on an external device known to be involved in the source of the instability, for example, a pressure sensor on a cryocooler gas line to measure the cycle, or a sensor on an elevator to monitor its level.

This detected change may be unpredictable and sporadic, such as the presence of moving ferromagnetic material in the vicinity of the fringe field of the MRI scanner. This could be due to the presence of moving cars, elevators, or subway lines, etc. in the vicinity of the MRI scanner.

After the change is detected, the parameters at which the first and second electromagnets are driven to reduce the instability in the imaging magnetic field due to the change may be changed at 204. The driving parameters of the electromagnets can be fixed or dynamically set based on the number of compensation coils deployed in the system and the required compensation accuracy. The first and second compensation coils may be dynamically shifted to cancel impingent electromagnetic fields. For example, the phase between the two waveforms, and the relative amplitude of the waveforms may be shifted.

Figure 3:
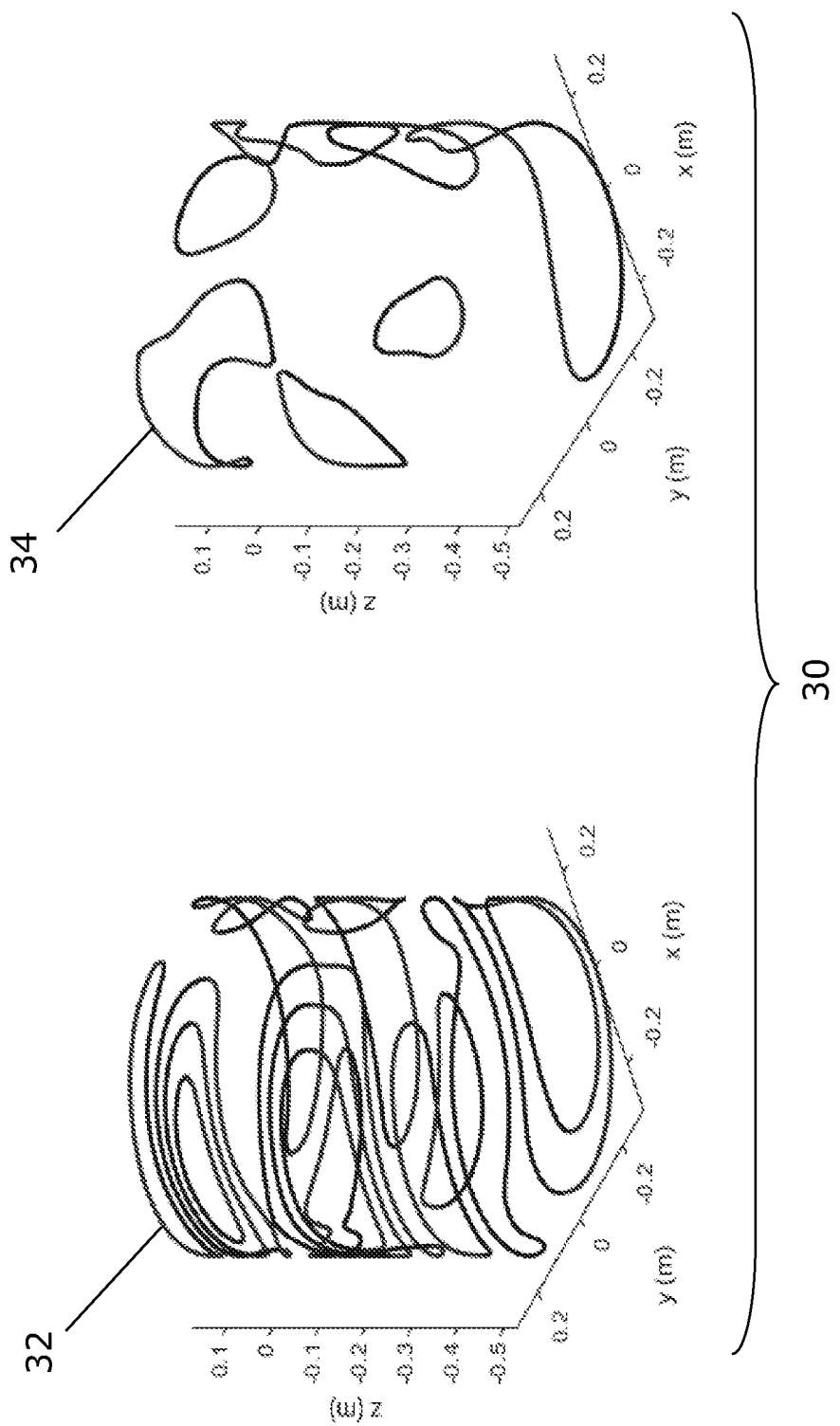
FIG. 3 depicts shim coils according an example embodiment of the present disclosure for reducing inhomogeneity in an imaging magnetic field during magnetic resonance imaging.

FIG. 3 illustrates an example of an exploded view of electromagnetic assembly 30 comprising actively driven electromagnets 32, 34 that may be used in methods 100 and 200 for reducing inhomogeneity in the imaging magnetic field during magnetic resonance imaging. The coils in electromagnet 32 depicted on the left are specifically designed to generate the first portion of the corrective magnetic field according to the first waveform, which in this example is the real component of the corrective magnetic field. The coils in electromagnet 34 depicted on the right are specifically designed to generate the second portion of the corrective magnetic field according to the second waveform, which in this example is the imaginary component of the corrective magnetic field. Electromagnets 32, 34 may be driven jointly or independently.

As noted above, first and second electromagnets 32, 34 in the depicted embodiment are shim coils. They may be used simultaneously, out of phase with one another, to reduce spatial and/or temporal inhomogeneity in the imaging magnetic field.

Custom electromagnets for use in MRI are typically referred to as "shims". Shims refer to any component in the MRI scanner—active or passive—that provides a favourable adjustment of the main field homogeneity. The shims described here are driven from a harmonic tone generator that provides both adequate current and a phase shift to 'tune' the electromagnets to the instability. If required, several higher-ordered harmonics can be included to reduce field instability.

Figure 4:
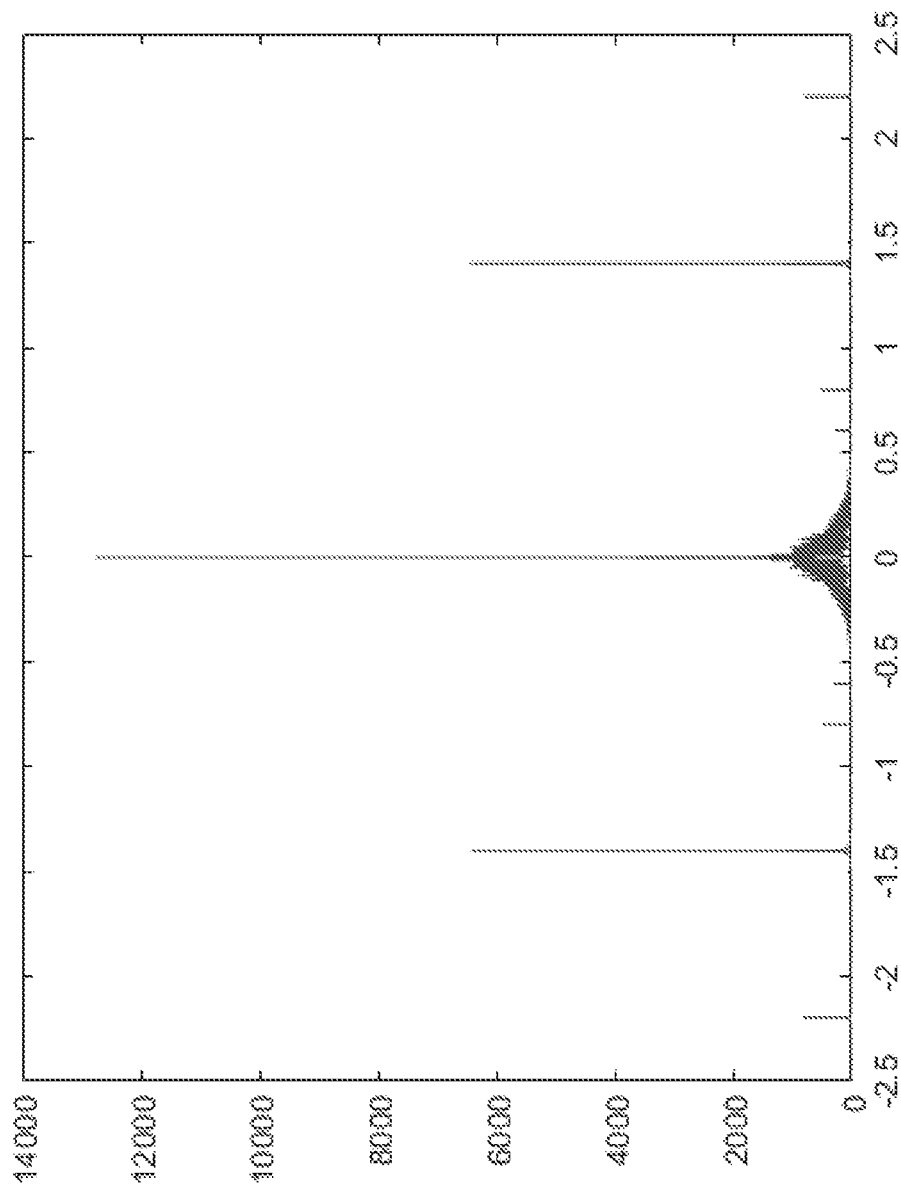
FIG. 4 illustrates a frequency spectrum prior to compensation of field instabilities.
Figure 5:
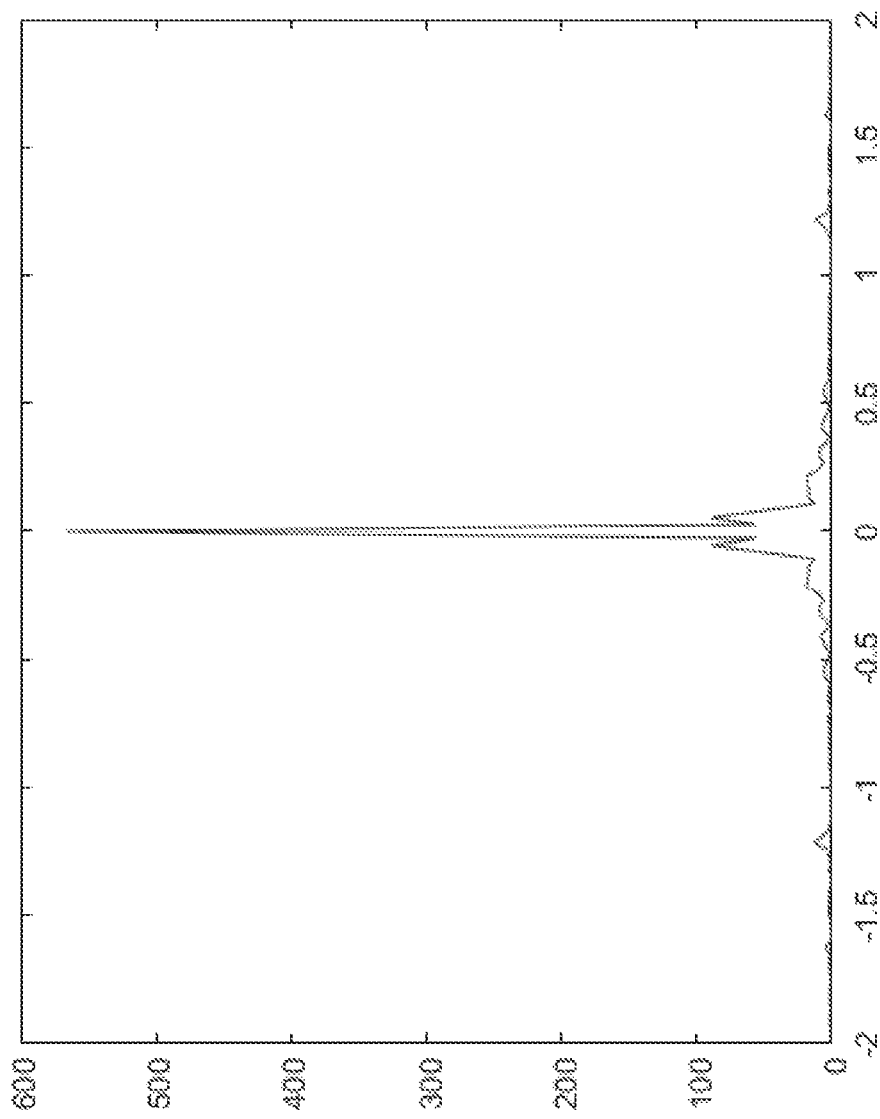
FIG. 5 illustrates a frequency spectrum after compensation of field instabilities, performed in accordance with examples described herein.

FIGS. 4 and 5 demonstrate an example of the above compensation effect when using first and second electromagnets 32, 34 when the instability is caused by a pulse tube in a cold head motor. A cold head motor expels a pulse of air that causes vibration every 1.4 Hz. FIG. 4 illustrates the frequency spectrum prior to compensation of the instability. The x-axis is in Hz, and the problem or instability is shown at approximately +/−1.4 Hz.

FIG. 5 illustrates the frequency spectrum after active compensation of the instability has been performed, for example as described above. As readily seen, the instability or problem at +/−1.4 Hz has been substantially mitigated after active compensation using first and second electromagnets 32, 34. Sensors on the cold head motor can trigger the compensation, for example, by detecting the change in the instability at 202 as described in method 200, thus dynamically syncing up the compensation with the cold head motor.

Figure 6:
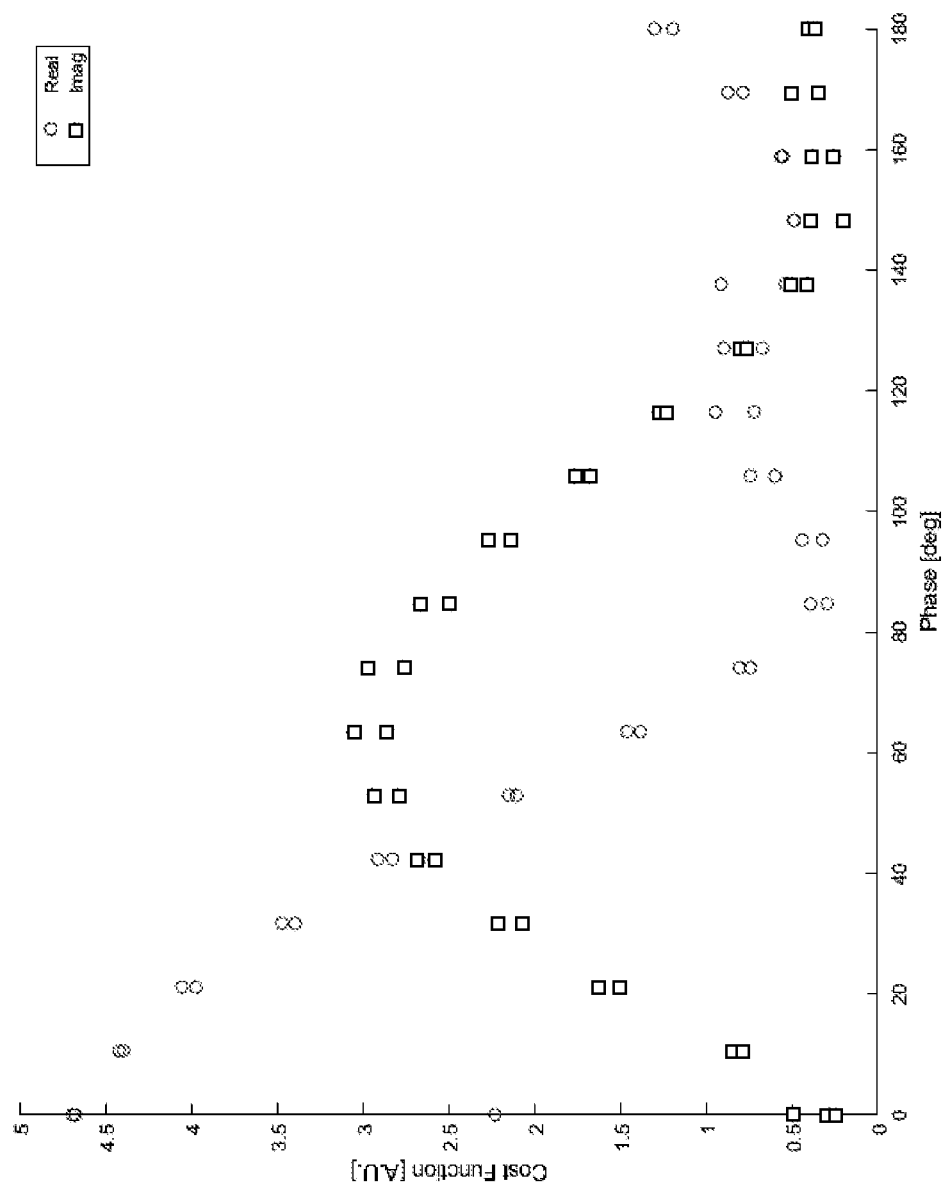
FIG. 6 illustrates the effect of actively tuning the current source to that of the pulse tube and directly cancelling both the real and imaginary (phase and magnitude) of the field instability.

FIG. 6 is a cost function graph that demonstrates the effect of actively tuning the current source to that of the pulse tube and directly cancelling both the real and imaginary (phase and magnitude) of the field instability. A lower cost is better or preferable in each case. As such, the optimal phase for real coil 32 is around 90 degrees, whereas the optimal phase for imaginary coil 34 is around 0 or 180 degrees. As understood by the skilled person, there are different optimal phases for different components. As such, the coils are to be driven with different phases (or with a phase shift therebetween) and amplitudes in order to compensate for magnetic field instabilities in space and time.

While electromagnetic assembly 30 is described to have two electromagnets 32, 34, it would be understood that more than two electromagnets or shims may be used. For example, another pair of shims or electromagnets, as described above, may be added for each problem source or instability.

In some examples, two shims may be designed based on the overall magnetic field distribution. Such a magnetic field distribution would, understandably, be specific to the particular location of the MRI system. In yet a further alternate embodiment, the corrective magnetic field may be decomposed into three or more parts or components, each with differing phases. In such a case, three or more shim coils may be designed, one shim to correspond with each decomposed component.

Figure 7:
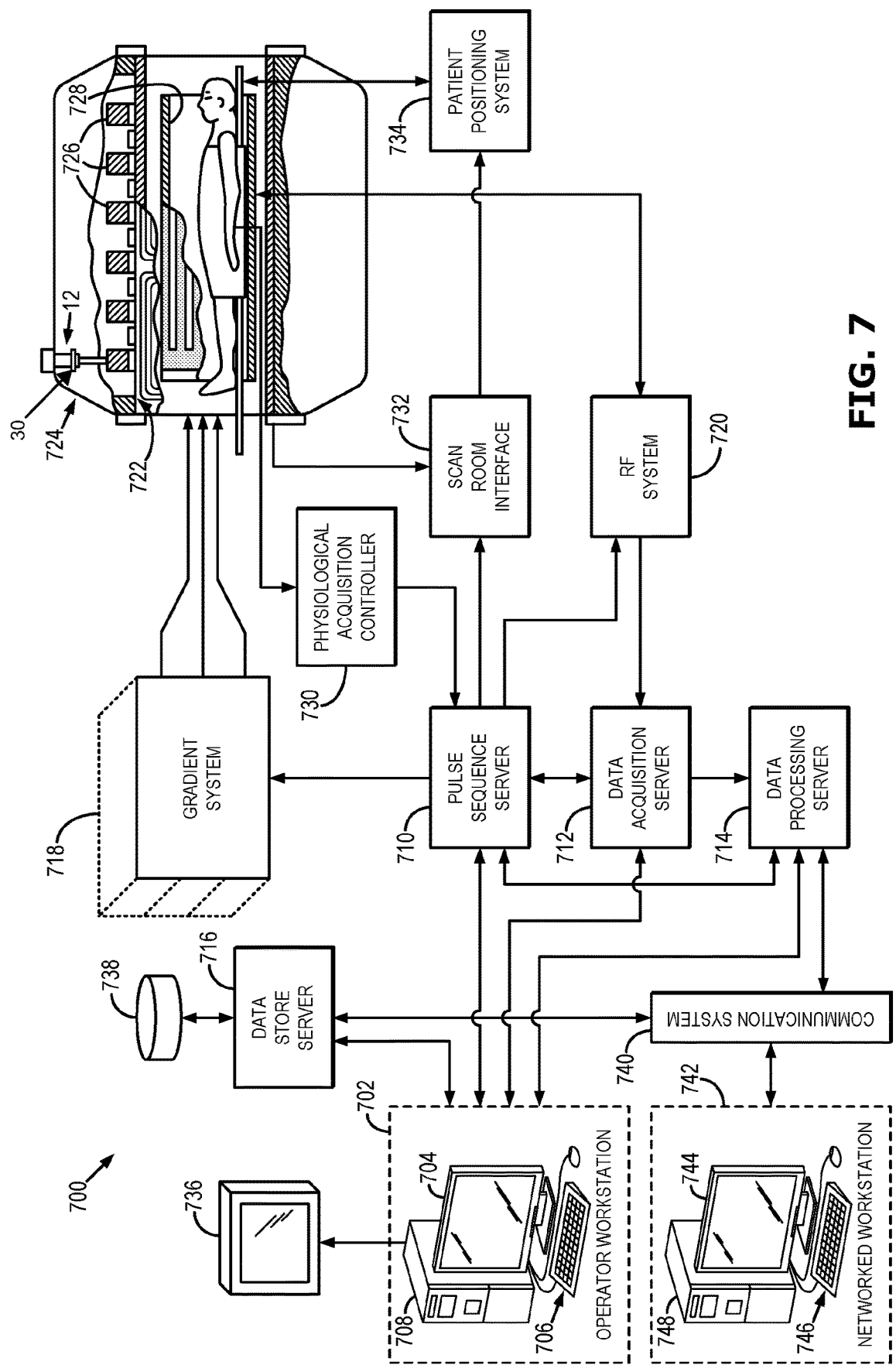
FIG. 7 is a block diagram of an example magnetic resonance imaging ("MRI") system, which incorporate the shim coils of FIG. 3.

Referring now to FIG. 7, an example of a MRI system 700 is illustrated which incorporates electromagnetic assembly 30 described above. In some examples, MRI system 700 may at least in part be used to perform methods 100 and 200. Additionally, the following discussion of MRI system 700 leads to further understanding of methods 100 and 200.

However, it is to be understood that MRI system 700, and methods 100 and 200 can be varied, and need not work exactly as discussed herein in conjunction with each other, and that such variations are within scope of the appended claims.

MRI system 700 includes an operator workstation 702, which will typically include a display 704; one or more input devices 706, such as a keyboard and mouse; and a processor 708. The processor 708 may include a commercially available programmable machine running a commercially available operating system. The operator workstation 702 provides the operator interface that enables scan prescriptions to be entered into the MRI system 700.

In general, the operator workstation 702 may be coupled to four servers: a pulse sequence server 710; a data acquisition server 712; a data processing server 714; and a data store server 716. The operator workstation 702 and each server 710, 712, 714, and 716 are connected to communicate with each other. For example, the servers 710, 712, 714, and 716 may be connected via a communication system 740, which may include any suitable network connection, whether wired, wireless, or a combination of both. As an example, the communication system 740 may include both proprietary or dedicated networks, as well as open networks, such as the internet The pulse sequence server 710 functions in response to instructions downloaded from the operator workstation 702 to operate a gradient system 718 and a radiofrequency ("RF") system 720. Gradient waveforms necessary to perform the prescribed scan are produced and applied to the gradient system 718, which excites gradient coils in an assembly 722 to produce the magnetic field gradients Gx, Gy, and Gz used for position encoding magnetic resonance signals. The gradient coil assembly 722 forms part of a magnet assembly 724 that includes a polarizing magnet 726 and a whole-body RF coil 728.

RF waveforms are applied by the RF system 720 to the RF coil 728, or a separate local coil (not shown in FIG. 7), in order to perform the prescribed magnetic resonance pulse sequence. Responsive magnetic resonance signals detected by the RF coil 728, or a separate local coil (not shown in FIG. 7), are received by the RF system 720, where they are amplified, demodulated, filtered, and digitized under direction of commands produced by the pulse sequence server 710. The RF system 720 includes an RF transmitter for producing a wide variety of RF pulses used in MRI pulse sequences. The RF transmitter is responsive to the scan prescription and direction from the pulse sequence server 710 to produce RF pulses of the desired frequency, phase, and pulse amplitude waveform. The generated RF pulses may be applied to the whole-body RF coil 728 or to one or more local coils or coil arrays (not shown in FIG. 7).

The RF system 720 also includes one or more RF receiver channels.

Each RF receiver channel includes an RF preamplifier that amplifies the magnetic resonance signal received by the coil 728 to which it is connected, and a detector that detects and digitizes the I and quadrature components of the received magnetic resonance signal. The magnitude of the received magnetic resonance signal may, therefore, be determined at any sampled point by the square root of the sum of the squares of the and Q components:

$$M=\sqrt{I^2+Q^2}$$

and the phase of the received magnetic resonance signal may also be determined according to the following relationship:

$$\varphi = \tan^{-1}\left(\frac{Q}{I}\right)$$

The pulse sequence server 710 also optionally receives patient data from a physiological acquisition controller 730. By way of example, the physiological acquisition controller 730 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 710 to synchronize, or "gate," the performance of the scan with the subject's heart beat or respiration.

The pulse sequence server 710 also connects to a scan room interface circuit 732 that receives signals from various sensors associated with the condition of the patient and the magnet system. It is also through the scan room interface circuit 732 that a patient positioning system 734 receives commands to move the patient to desired positions during the scan.

The digitized magnetic resonance signal samples produced by the RF system 720 are received by the data acquisition server 712. The data acquisition server 712 operates in response to instructions downloaded from the operator workstation 702 to receive the real-time magnetic resonance data and provide buffer storage, such that no data is lost by data overrun. In some scans, the data acquisition server 712 does little more than pass the acquired magnetic resonance data to the data processor server 714. However, in scans that require information derived from acquired magnetic resonance data to control the further performance of the scan, the data acquisition server 712 is programmed to produce such information and convey it to the pulse sequence server 710.

For example, during pre-scans, magnetic resonance data is acquired and used to calibrate the pulse sequence performed by the pulse sequence server 710. As another example, navigator signals may be acquired and used to adjust the operating parameters of the RF system 720 or the gradient system 718, or to control the view order in which k-space is sampled. In still another example, the data acquisition server 712 may also be employed to process magnetic resonance signals used to detect the arrival of a contrast agent in a magnetic resonance angiography ("MRA") scan. By way of example, the data acquisition server 712 acquires magnetic resonance data and processes it in real-time to produce information that is used to control the scan.

The data processing server 714 receives magnetic resonance data from the data acquisition server 712 and processes it in accordance with instructions downloaded from the operator workstation 702. Such processing may, for example, include one or more of the following: reconstructing two-dimensional or three-dimensional images by performing a Fourier transformation of raw k-space data; performing other image reconstruction algorithms, such as iterative or back projection reconstruction algorithms; applying filters to raw k-space data or to reconstructed images; generating functional magnetic resonance images; calculating motion or flow images; and so on.

Images reconstructed by the data processing server 714 are conveyed back to the operator workstation 702 where they are stored. Real-time images are stored in a data base memory cache (not shown in FIG. 7), from which they may be output to operator display 702 or a display 736 that is located near the magnet assembly 724 for use by attending physicians. Batch mode images or selected real time images are stored in a host database on disc storage 738. When such images have been reconstructed and transferred to storage, the data processing server 714 notifies the data store server 716 on the operator workstation 702. The operator workstation 702 may be used by an operator to archive the images, produce films, or send the images via a network to other facilities.

The MRI system 700 may also include one or more networked workstations 742. By way of example, a networked workstation 742 may include a display 744; one or more input devices 746, such as a keyboard and mouse; and a processor 748. The networked workstation 742 may be located within the same facility as the operator workstation 702, or in a different facility, such as a different healthcare institution or clinic.

The networked workstation 742, whether within the same facility or in a different facility as the operator workstation 702, may gain remote access to the data processing server 714 or data store server 716 via the communication system 740. Accordingly, multiple networked workstations 742 may have access to the data processing server 714 and the data store server 716. In this manner, magnetic resonance data, reconstructed images, or other data may be exchanged between the data processing server 714 or the data store server 716 and the networked workstations 742, such that the data or images may be remotely processed by a networked workstation 742. This data may be exchanged in any suitable format, such as in accordance with the transmission control protocol ("TCP"), the internet protocol ("IP"), or other known or suitable protocols.

Electromagnetic assembly 30 may be incorporated into MRI system 700 in a number of different ways. For example, in the embodiment depicted in FIG. 7, electromagnetic assembly 30 is positioned proximate a cold head 12 of a mechanical cryocooler, cold head 12 being the source of the magnetic field instability in this case. Electromagnetic assembly 30 may be driven by one of the controllers according to the methods described above.

Because the magnetic moment of the material depends on the magnitude of the external field, if the magnetic moments of the materials in the cold head are reduced, the field instability effects will be reduced as well. The magnetic moment in the cold head materials can be reduced by shielding the magnetic field around the cold head with electromagnet assembly 30. Electromagnetic assembly 30 may be driven by one of the controllers according to the methods described above.

In an alternate embodiment, rather than being positioned proximate the source of the magnetic field instability, electromagnetic assembly 30 may form part of magnet assembly 724 and/or part of gradient coil assembly 722.

MRI system 700 may further include a sensor for detecting the change in the instability in the imaging magnetic field. In such a case, the sensor would be operatively coupled to first and second electromagnets or shim coils 32, 34 of electromagnetic assembly 30 for dynamically changing parameters at which first and second shim coils 32, 34 are driven to reduce the instability in the imaging magnetic field due to the change. As noted above, first and second electromagnets 32, 34 may be driven in MRI system 700 together or independently.

It will be appreciated that the above magnetic field compensation methods and systems may be implemented alone or in combination with other compensation methods and systems, including passive shimming, depending on the type and severity of the field instability.

While some embodiments or aspects of the present disclosure may be implemented in fully functioning computers and computer systems, other embodiments or aspects may be capable of being distributed as a computing product in a variety of forms and may be capable of being applied regardless of the particular type of machine or computer readable media used to actually effect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as read-only memory (ROM), volatile random access memory (RAM), non-volatile memory, cache or a remote storage device.

A computer readable storage medium may be used to store software and data which when executed by a data processing system causes the system to perform various methods or techniques of the present disclosure. The executable software and data may be stored in various places including for example ROM, volatile RAM, non-volatile memory and/or cache. Portions of this software and/or data may be stored in any one of these storage devices.

Examples of computer-readable storage media may include, but are not limited to, recordable and non-recordable type media such as volatile and non-volatile memory devices, ROM, RAM, flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like. The storage medium may be the internet cloud, or a computer readable storage medium such as a disc.

Furthermore, at least some of the methods described herein may be capable of being distributed in a computer program product comprising a computer readable medium that bears computer usable instructions for execution by one or more processors, to perform aspects of the methods described. The medium may be provided in various forms such as, but not limited to, one or more diskettes, compact disks, tapes, chips, USB keys, external hard drives, wire-line transmissions, satellite transmissions, internet transmissions or downloads, magnetic and electronic storage media, digital and analog signals, and the like. The computer useable instructions may also be in various forms, including compiled and non-compiled code.

At least some of the elements of the systems described herein may be implemented by software, or a combination of software and hardware. Elements of the system that are implemented via software may be written in a high-level procedural language such as object oriented programming or a scripting language. Accordingly, the program code may be written in C, C++, J++, or any other suitable programming language and may comprise modules or classes, as is known to those skilled in object oriented programming. At least some of the elements of the system that are implemented via software may be written in assembly language, machine language or firmware as needed. In either case, the program code can be stored on storage media or on a computer readable medium that is readable by a general or special purpose programmable computing device having a processor, an operating system and the associated hardware and software that is necessary to implement the functionality of at least one of the embodiments described herein. The program code, when read by the computing device, configures the computing device to operate in a new, specific and predefined manner in order to perform at least one of the methods described herein.

While the teachings described herein are in conjunction with various embodiments for illustrative purposes, it is not intended that the teachings be limited to such embodiments. On the contrary, the teachings described and illustrated herein encompass various alternatives, modifications, and equivalents, without departing from the described embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

The invention claimed is:

1. A method for reducing instability in an imaging magnetic field within an imaging bore of a magnetic resonance imagining (MRI) system during magnetic resonance imaging, the method comprising:
identifying an instability within the imaging magnetic field;
determining a stability field in response to the instability in the imaging magnetic field, the stability field being a magnetic field that is similar but opposite to that caused by the instability in the imaging magnetic field;
decomposing the stability field temporally into Fourier domain and extracting amplitude and phase for each spatial position as stability parameters;
creating at least two spatial magnetic field components from the stability parameters with a phase separation therebetween as a first magnetic field component and a second magnetic field component; and
generating the first and second magnetic field components as a corrective magnetic field within the imaging bore of the MRI system during imaging to reduce the instability in the imaging magnetic field.

2. The method of claim 1, wherein the first and second magnetic field components are, respectively, an in-phase magnetic field component and an out-of-phase magnetic field component.

3. The method of claim 2, wherein the phase separation is 90 degrees.

4. The method of claim 1, further comprising designing a first electromagnet to generate the first magnetic field component, and designing a second electromagnet to generate the second magnetic field component.

5. The method of claim 1, wherein generating the corrective magnetic field comprises:
driving a first electromagnet designed to generate the first magnetic field component of the corrective magnetic field with a first waveform; and
driving a second electromagnet designed to generate the second magnetic field component of the corrective magnetic field with a second waveform.

6. The method of claim 5, wherein the first electromagnet is a first shim coil and the second electromagnet is a second shim coil.

7. The method of claim 5, wherein the instability in the imaging magnetic field is constant or sporadic over time.

8. The method of claim 7, wherein the instability is sporadic over time, the method further comprising:
detecting a change in the instability in the imaging magnetic field;
dynamically changing parameters at which the first and second electromagnets are driven to reduce the instability in the imaging magnetic field due to the change.

9. A system for reducing instability in an imaging magnetic field in an imaging bore of a magnetic resonance imaging (MRI) system during imaging, the system comprising:
a processor having memory containing instructions to:
identify an instability within the imaging magnetic field;
determine a stability field in response to the instability in the imaging magnetic field, the stability field being a magnetic field that is similar but opposite to that caused by the instability in the imaging magnetic field;
decompose the stability field temporally into Fourier domain and extracting amplitude and phase for each spatial position as stability parameters; and
create at least two spatial magnetic field components from the stability parameters with a phase separation therebetween as a first magnetic field component and a second magnetic field component; and
an electromagnet assembly coupled to the processor to receive the first and second magnetic field components therefrom, the electromagnet assembly configured to generate the first and second magnetic field components as a corrective magnetic field in the imaging bore of the MRI system to reduce the instability in the imaging magnetic field.

10. The system of claim 9, wherein the first and second magnetic field components are, respectively, an in-phase magnetic field component and an out-of-phase magnetic field component.

11. The system of claim 10, wherein the phase shift is a 90 degree phase shift.

12. The system of claim 9, wherein the electromagnet assembly comprises:
a first electromagnet designed to generate the first magnetic field component of the corrective magnetic field with a first waveform; and
a second electromagnet designed to generate the second magnetic field component of the corrective magnetic field with a second waveform.

13. The system of claim 9, wherein the first electromagnet is a first shim coil and the second electromagnet is a second shim coil.

14. The system of claim 13, wherein the first and second shim coils are independently driven.

15. The system of claim 12, further comprising:
a sensor for detecting a change in the instability in the imaging magnetic field, the sensor operatively coupled to the first and second electromagnets for dynamically changing parameters at which the first and second shim coils are driven to reduce the instability in the imaging magnetic field due to the change.

* * * * *